(12) United States Patent
Weber et al.

(10) Patent No.: US 7,242,537 B2
(45) Date of Patent: Jul. 10, 2007

(54) HOLDING AND POSITIONING APPARATUS FOR AN OPTICAL ELEMENT

(75) Inventors: Ulrich Weber, Ulm (DE); Hubert Holderer, Oberkochen (DE)

(73) Assignee: Carl Zeiss SMT AG, Oberkochen (DE)

( * ) Notice: Subject to any disclaimer, the term of this patent is extended or adjusted under 35 U.S.C. 154(b) by 3 days.

(21) Appl. No.: 10/944,135

(22) Filed: Sep. 17, 2004

(65) Prior Publication Data
US 2006/0007563 A1   Jan. 12, 2006

(30) Foreign Application Priority Data
Sep. 24, 2003  (DE) ................ 103 44 178

(51) Int. Cl.
*G02B 7/02* (2006.01)
(52) U.S. Cl. ............... 359/811; 359/212; 359/223; 359/872
(58) Field of Classification Search ............ 359/811
See application file for complete search history.

(56) References Cited

U.S. PATENT DOCUMENTS

| | | | |
|---|---|---|---|
| 5,896,193 A | 4/1999 | Colbourne et al. ......... 356/124 |
| 5,986,827 A * | 11/1999 | Hale ......................... 359/822 |
| 6,229,657 B1 | 5/2001 | Holderer et al. ............. 359/822 |
| 6,259,571 B1 | 7/2001 | Holderer et al. ............. 359/819 |
| 6,402,329 B1 * | 6/2002 | Bailly et al. ................ 359/872 |
| 6,445,515 B2 | 9/2002 | Moennig .................... 359/814 |
| 6,466,380 B2 | 10/2002 | Bischoff .................... 359/739 |
| 6,538,829 B2 | 3/2003 | Rau et al. ................... 359/819 |
| 6,552,862 B2 | 4/2003 | Dieker ....................... 359/819 |
| 6,580,570 B2 | 6/2003 | Becker et al. .............. 359/819 |
| 6,594,093 B2 | 7/2003 | Moeller et al. ............. 359/824 |
| 6,603,615 B2 | 8/2003 | Melzer et al. .............. 359/823 |
| 6,667,255 B2 | 12/2003 | Hexels ....................... 442/393 |
| 6,667,839 B2 | 12/2003 | Hartmaier et al. .......... 359/820 |
| 6,717,742 B2 | 4/2004 | Weber ........................ 359/694 |
| 6,727,984 B2 | 4/2004 | Becht ........................ 356/5.01 |
| 6,733,369 B1 | 5/2004 | Stacklies et al. ............. 451/42 |
| 6,768,600 B2 | 7/2004 | Dieker ....................... 359/820 |
| 6,791,768 B2 | 9/2004 | Rau ........................... 359/819 |
| 6,798,588 B2 | 9/2004 | Vogt .......................... 359/819 |
| 6,816,325 B1 | 11/2004 | Becker et al. .............. 359/819 |
| 6,825,914 B2 | 11/2004 | Schroeder et al. ............ 355/30 |
| 6,829,107 B2 | 12/2004 | Osterried .................... 359/811 |
| 6,844,994 B2 | 1/2005 | Melzer et al. .............. 359/824 |
| 6,870,632 B2 * | 3/2005 | Petasch et al. .............. 356/614 |
| 6,906,848 B2 * | 6/2005 | Aubuchon ................... 359/291 |
| 2002/0167734 A1 | 11/2002 | Schuster ..................... 359/636 |
| 2002/0176094 A1 | 11/2002 | Petasch et al. .............. 359/614 |

FOREIGN PATENT DOCUMENTS

JP   2002072057 A   3/2002

* cited by examiner

*Primary Examiner*—Jordan Schwartz
*Assistant Examiner*—Jessica Stultz
(74) *Attorney, Agent, or Firm*—Wells St. John, P.S.

(57) ABSTRACT

In a holding and positioning apparatus for an optical element, the optical element is mounted in a mounting ring and the mounting ring is mounted via at least one manipulator unit. The manipulator unit has a linear actuating element. The manipulator unit has a manipulator head, a movable manipulator part and a manipulator foot, the manipulator head being connected to the movable manipulator part via a solid body joint. The movable manipulator part is connected to the manipulator foot via an actuator and at least one solid body joint, the linear actuating element being coupled to the manipulator foot and the actuator.

16 Claims, 8 Drawing Sheets

HOLDING AND POSITIONING APPARATUS FOR AN OPTICAL ELEMENT

CROSS REFERENCE TO RELATED APPLICATION

This application relates to and claims priority to corresponding German Patent Application No. 103 44 178.6, which was filed on Sep. 24, 2003, and which is incorporated by reference herein.

BACKGROUND OF THE INVENTION

1. Field of the Invention

The invention relates to a holding and positioning apparatus for an optical element, a manipulator unit for moving an optical element and a projection objective for semiconductor lithography.

2. Description of the Related Art

A projection objective, as disclosed by U.S. 2002/0167734 A1, for example, contains a beam splitter and a deflection mirror. While a light beam coming from a reticle is deflected by the beam splitter into a radial arm having a further mirror, the light beam coming from the radial arm is let straight through the beam splitter and deflected by the deflection mirror, parallel to the light beam coming from the reticle, into a further objective region.

In order that the light beam from the radial arm can be deflected into the objective region, it must be possible for the mirror plane of the deflection mirror to be displaced accurately into the point of intersection of the optical axes of radial arm and objective region. Furthermore, the normal to the mirror plane must be oriented toward the bisector of the angle which is formed by the optical axis of the radial arm and the optical axis of the objective region. For the positioning of the deflection mirror at the point of intersection of the optical axes of radial arm and objective region, it must be possible for the deflection mirror to be displaced in a translational manner normally with respect to its mirror plane. In order to orient the mirror plane normal to the bisector, it must be possible for the deflection mirror to be tilted about two mutually independent axes in the mirror plane.

By means of a subsequent change in the position or tilt angle of the deflection mirror, an image offset is primarily produced, the image being displaced with respect to the original image as a result. If vibration of the deflection mirror occurs, then the structures to be imaged in a projection objective for semiconductor lithography during the exposure process become blurred. This leads to an undesired loss of contrast and therefore to a reduction in the resolution of the objective.

Projection objectives for semiconductor lithography having holding and positioning devices for optical elements are known from the general prior art.

U.S. Pat. No. 5,986,827 discloses an actuator or a lifting and tilting apparatus for a workpiece. The actuator has three identical spring units, a structure on which the spring units are mounted, and three linear actuators. For the lifting and tilting mechanism, an inner ring, which carries the workpiece and has three bipods, as they are known, is provided, the latter each representing two rods arranged in a V shape and having spring joints at their ends, which are connected to one another at one end and which can transmit forces only along their longitudinal axis. The end of each bipod at which the rods are led together is in each case fastened to a lever, which is mounted in the structure or in the housing such that it can rotate and can be fixed with respect to the housing by setting screws. By means of tilting the respective levers with the setting screws, the inner ring together with the workpiece can both be adjusted vertically and tilted.

The disadvantage with the actuator and the lifting and tilting apparatus of U.S. Pat. No. 5,986,827 is the very large amount of space which is required, which results from the separation of bipod and actuating lever. Since, for production reasons, the bipods and the actuating levers have to be assembled from different parts, the bipod spring joints also have to compensate for the additional production and mounting tolerances, for which reason the bipods are relatively soft, so that the workpiece mounted by them can quite easily be excited to undesired oscillations.

Furthermore, U.S. Pat. No. 5,896,193 discloses a tilting and lifting apparatus having spring elements and at least one pneumatic cylinder. The pneumatic cylinder is arranged between an upper and lower structure and connected to the latter, in order to provide a constant rotational counterforce to the upper structure, which carries its own weight. The upper structure can be tilted and moved in the vertical direction and also relative to the lower structure. The upper structure is carried by the lower structure via three spring elements. Each spring element can move in the vertical direction but is kinematically stiff in the horizontal plane. Each spring element has three arms which are connected to one another in a Z shape. A drive unit is connected both to the spring element and to the lower structure. The upper structure is therefore very stiff in the horizontal direction. By means of an arrangement of this type, the spring elements are used to guide the upper structure in relation to the lower structure.

The disadvantage with such an apparatus is that, as a result of guiding the upper structure by means of the spring elements, the upper structure can be deformed and, as a result of the rectilinear guidance, the angles cannot be compensated.

SUMMARY OF THE INVENTION

It is therefore an object of the invention to provide a holding and positioning apparatus for an optical element, in particular for a mirror, with which the disadvantages of the prior art mentioned at the beginning are avoided, the optical element can be positioned exactly and impermissible imaging errors can be compensated.

The holding and positioning apparatus for the optical element according to the invention suppresses undesired vibration of the optical element by means of a stiff attachment. It is likewise advantageous that, by means of the at least one manipulator unit, the holding and positioning apparatus is additionally able to compensate for the length differences between the optical element and a base body, to which the at least one manipulator unit is connected, in the event of a deviation from the mounting temperature, in order that the forces on the optical element do not become impermissibly high and lead to deformations or even to damage to the optical element. As a result of having solid body joints, it is likewise possible for the irregularities in joint faces to be compensated for without deforming the optical element impermissibly.

In an advantageous refinement of the invention, three manipulator units can be provided. This holding and positioning apparatus, configured in accordance with the invention, makes it possible to displace the optical element exactly normally with respect to its plane and to tilt it about two mutually independent axes in the plane. Impermissible imaging errors are thus avoided.

In order that the optical element is mounted as stiffly as possible with respect to vibrations in the plane of the optical element, in an advantageous development of the invention provision can be made for the three manipulator units to be arranged in such a way that a reference point is located at the geometric center of gravity of the triangle covered by the manipulator units.

In an advantageous development of the invention, provision can, moreover, be made for at least three sensors to be provided in order to measure lifting and tilting movements of the optical element with respect to a base body. Thus, advantageously, the movement of the optical element during the lifting and tilting adjustment of the optical element can be measured, in order to be able to monitor the magnitude of the lift and the tilt and correct any possible disruptive movement.

As a result of its design configuration, the manipulator unit according to the invention has small dimensions, thus being capable of use advantageously in the presence of small spaces.

By means of the projection objective according to the invention, the structures to be imaged are imaged with high contrast during the exposure process, which leads to a higher resolution of the projection objective. Exemplary embodiments of the invention will be explained in more detail below using the drawings.

DETAILED DESCRIPTION

Figure 1:
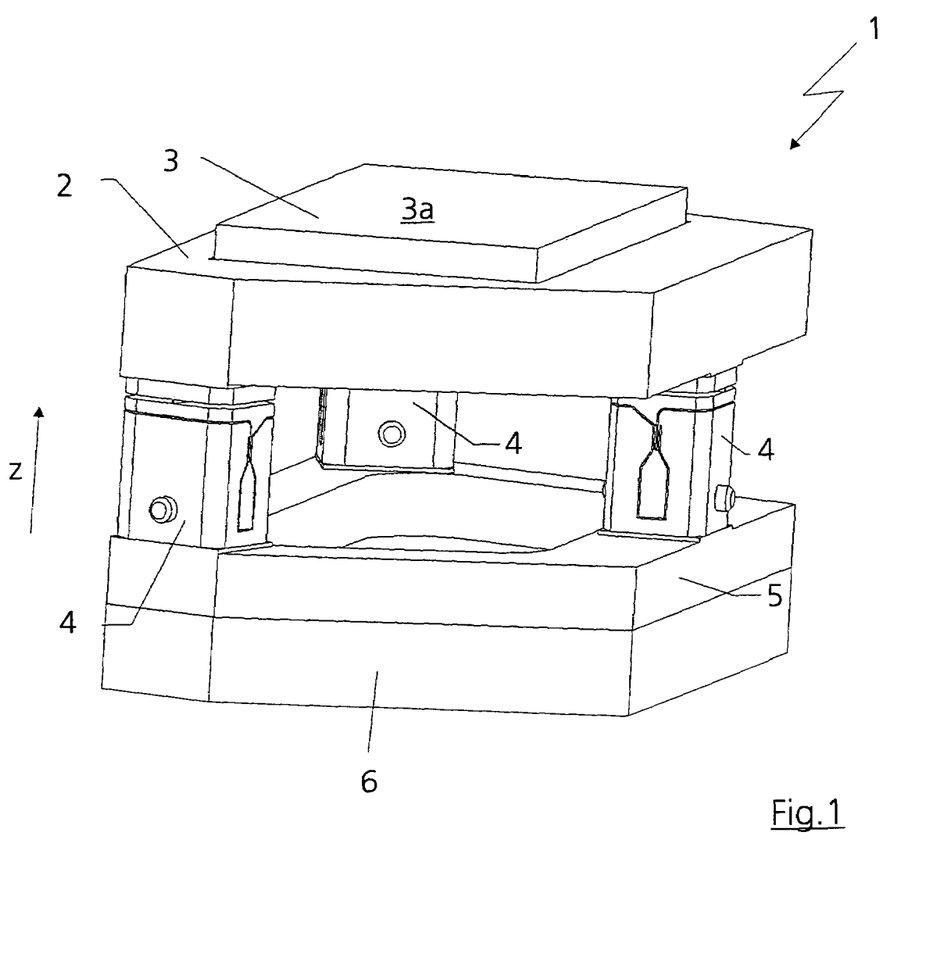
FIG. 1 is a perspective illustration of a holding and positioning apparatus.

FIG. 1 shows a holding and positioning apparatus 1 for a projection objective for semiconductor lithography, an optical element 3 being mounted in a mounting ring 2. The optical element 3 is formed as a mirror, preferably as a deflection mirror. The mounting ring 2 is carried and supported by three manipulator units 4, which are firmly connected to a base body 5. The base body 5 is connected in the usual way to a housing (objective housing) or a structure 6. The three manipulator units 4 can be adjusted vertically independently of one another along an optical axis (in the z direction), by which means the mounting ring 2 together with the mirror 3 can be raised at right angles to a mirror plane 3a or tilted about at least one arbitrary axis in the mirror plane 3a.

Figure 2:
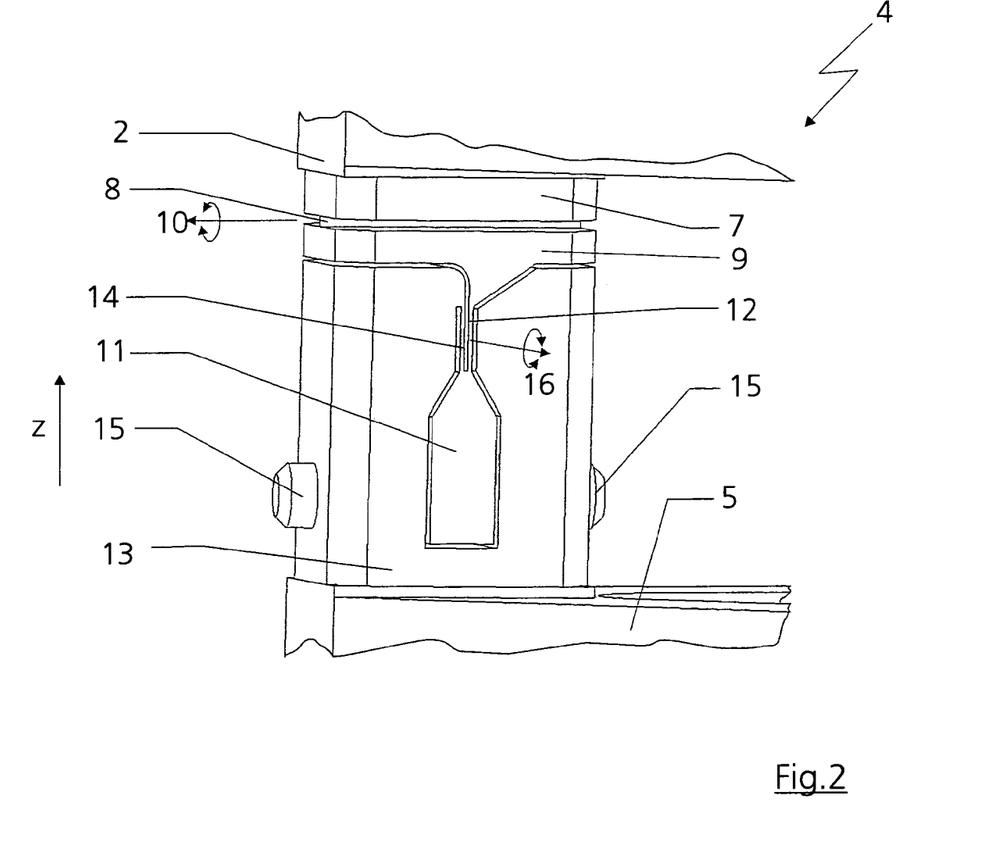
FIG. 2 is a perspective illustration of a manipulator unit.

In FIG. 2, the manipulator unit 4 is illustrated in principle. The manipulator unit 4 has a manipulator head 7 which is connected to the mounting ring 2. The manipulator head 7 is connected to a movable manipulator part 9 via a solid body joint 8, advantageously a spring tilting joint. The solid body joint 8 permits tilting and rotation of the manipulator head 7 by means of bending about an axis 10. The movable manipulator part 9 is connected by an actuator 11 via at least one solid body joint 12 to a manipulator foot 13. A tilting and bending axis 16 of the solid body joint 12 is arranged at right angles to the axis 10 of the solid body joint 8. The solid body joint 12 is preferably formed as a leaf spring and, by means of bending and torsion, is able to implement the other two degrees of rotational freedom and, by means of s-shaped bending, to implement the degrees of translational freedom along the axis 10 of the manipulator head 7. The solid body joint 12 connects the movable manipulator part 9 to the actuator 11, which in turn is connected to the manipulator foot 13 such that it can rotate, via a solid body joint 14, which is likewise implemented as a leaf spring. The manipulator foot 13 is firmly connected to the objective housing 6 via the base body 5, the objective housing 6 not being illustrated in this exemplary embodiment.

The actuator 11, which is implemented as an actuating lever here, can be tilted with respect to the manipulator foot 13 by bending the solid body joint 14, the angle of the actuator 11 being set and fixed by linear actuating elements 15. The linear actuating elements 15 are formed as setting screws in the exemplary embodiments, it also being possible for other linear actuating elements, such as piezoelectric actuators, magnetostrictive actuators, magnets or other drive elements to be used.

By means of a laterally offset arrangement of the solid body joint 12 in relation to the solid body joint 14, the solid body joint 12 performs a movement in the vertical direction (z direction) when the actuator 11 is tilted. As a result, the solid body joint 12 raises and lowers the manipulator head 7 with the optical element 3 and the mounting ring 2, the solid body joint 12 simultaneously compensating for the tilt angle of the actuator 11 in relation to the manipulator head 7. The solid body joint 12 is used not only to compensate for the angle between the manipulator head 7 and the actuator 11 when the actuator 11 is deflected, but also in the other two manipulator units 4, which are not actuated at this instant, as a rotary joint about an axis of rotation which is determined by the two passive manipulator units 4.

For each of the three manipulator units 4, the possibility is provided of displacing the manipulator head 7 in the vertical direction (z direction). The optical element 3 can therefore also be displaced in the vertical direction and tilted about two mutually independent axes 10 and 16, which cover the plane 3a.

By means of the solid body joint 8 and the solid body joint 12 in the manipulator unit 4, which in the assembly of the three manipulator units 4 form a statically determined mounting for the mounting ring 2, deformation decoupling is provided for the mounting ring 2 and therefore also for the mirror 3.

The deformation decoupling and the manipulation possibility are combined by attaching the solid body joint 12 to the integrated actuator 11 in one component, namely the manipulator unit 4.

The solid body joint 8 compensates for angular errors between the mounting ring 2 and the base body 5 about the axis 10, while the solid body joint 12 compensates for angular errors between the mounting ring 2 and the base body 5 about the axis 16 and offset errors between the mounting ring 2 and the base body 5 in the direction of the axis 10.

If there are different heights of the manipulator units 4 or irregularities of the joint faces for the manipulator units 4 on the mounting ring 2 and the base body 5, it is possible for tilting of the mounting ring 2 with respect to the base body 5 to occur. This tilt angle is compensated for via the solid body joint 8 and the solid body joint 12, it being possible for the solid body joint 8 to be tilted about the axis 10 and for the solid body joint 12 to be tilted about the axis 16.

As a result of a change in the ambient temperature, for example during transport of the projection objective with the holding and positioning apparatus 1 contained therein, the mirror 3 in conjunction with the mounting ring 2 can expand with respect to the base body 5, since the mirror 3 and the mounting ring 2 normally have different temperature expansion coefficients from those of the base body 5 and the objective housing 6. Compensation of this type in the event of temperature changes is thus performed by the manipulator units 4 which are arranged between the mirror 3 and the base structure 5. This is also possible when fixing the actuator 11. In order to compensate for expansion differences, the manipulator units 4 should if possible have a material which provides a very low thermal expansion coefficient. This can be, for example, INVAR or else a ceramic material. By means of compensating for the temperature differences, forces on the mirror 3, which otherwise could lead to deformations of or even to damage to the mirror 3, are thus minimized.

In addition, irradiation of the mirror 3 during operation leads to expansion of the mirror 3 with respect to the base body 5, since the mirror 3 heats up to a substantially greater extent than the base body 5. These temperature expansions are compensated for by the solid body joint 12, since the solid body joint 12 permits displacement of the mounting ring 2 with respect to the base body 5 in the direction of the axis 10.

Figure 3:
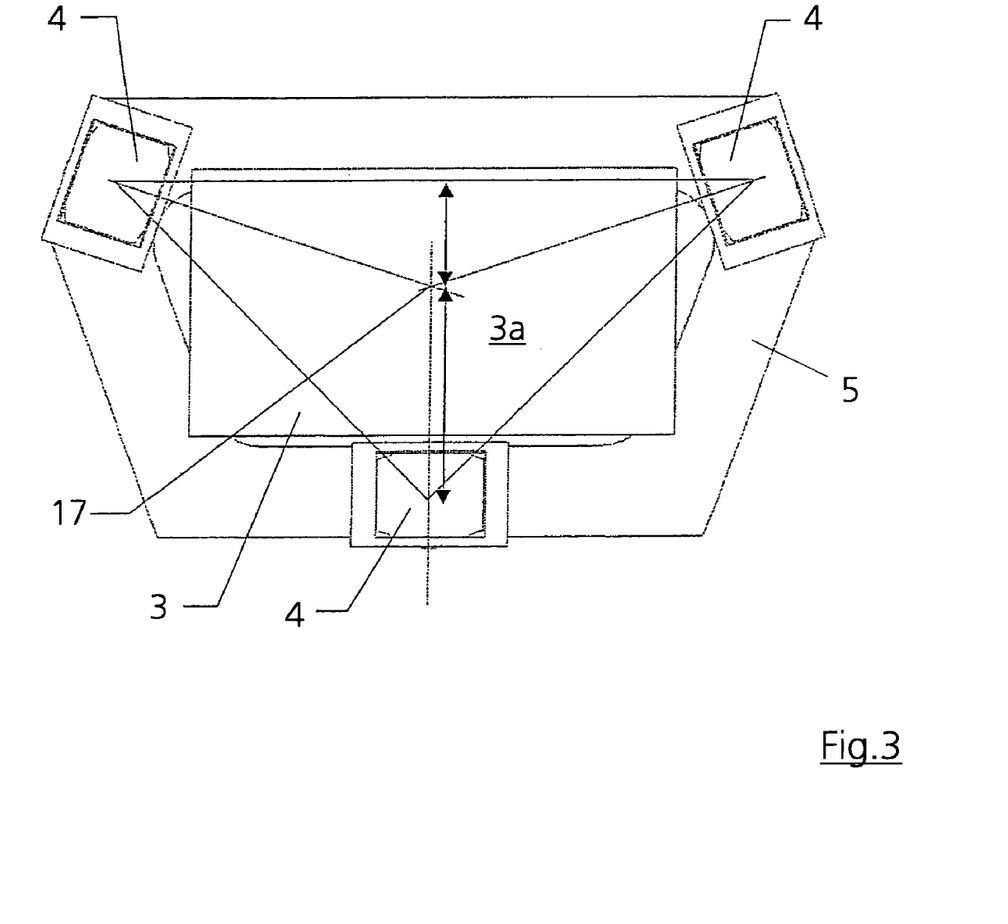
FIG. 3 is an illustration of the principle of the manipulator unit in plan view.

FIG. 3 shows an illustration of the principle of an arrangement of the manipulator units 4 in plan view. In order to determine the position of the mirror 3 with respect to the base body 5 or the objective housing 6, a reference point 17 is defined, which ideally coincides with the point of intersection of the optical axis in the mirror plane 3a. The position of the reference point 17 identifies the position of the mirror 3 with respect to the objective housing 6 or the base body 5 which is firmly connected to the objective housing 6. Following the adjustment of the mirror 3, the reference point 17 must no longer move, or only within a small tolerance, with respect to the objective housing 6 during the entire lifetime of the projection objective (not illustrated).

In order that the mirror 3 is mounted as stiffly as possible with respect to oscillations in the mirror plane 3a, the manipulator units 4 should if possible be arranged in such a way that the reference point 17 lies at the geometric center of gravity of the triangle covered by the manipulator units 4.

Figure 4:
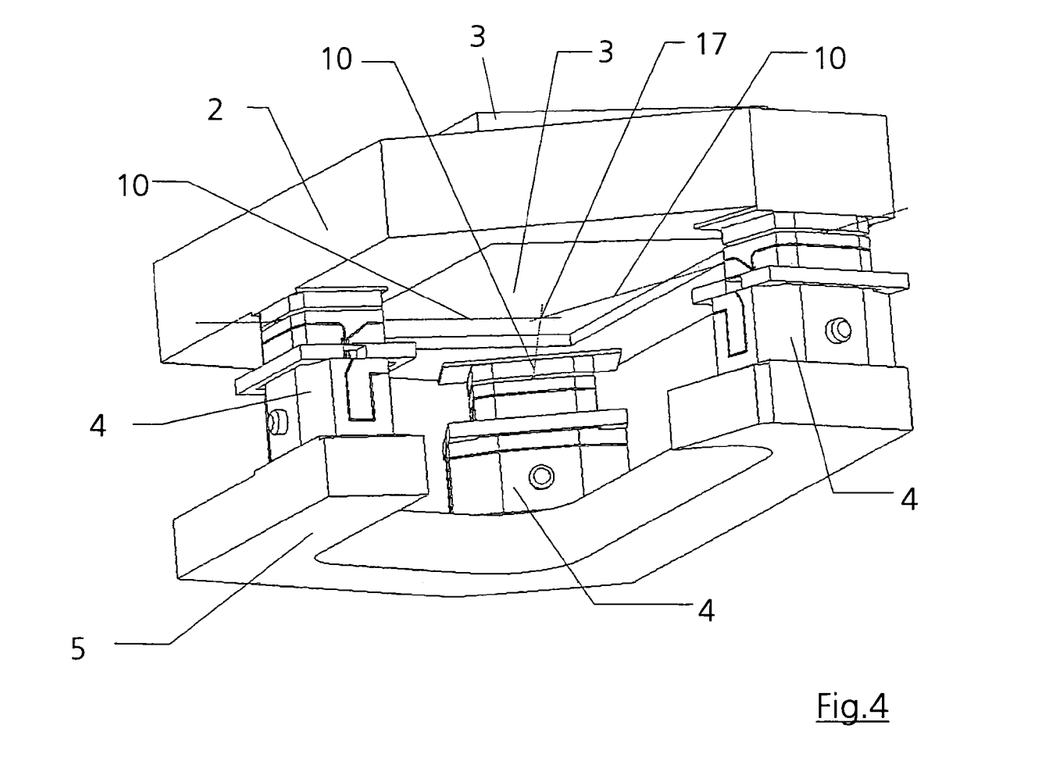
FIG. 4 is a perspective illustration of the holding and positioning apparatus from FIG. 1 obliquely from below.

FIG. 4 shows a perspective illustration of the holding and positioning apparatus 1 that can be seen in FIG. 1, obliquely from below. In order that the mirror 3 is not decentered with respect to the base body 5, the three manipulator units 4 should be arranged such that the directions of movement of the displacements along the axis 10 made possible by the solid body joint 12 intersect at the reference point 17 of the mirror 3. The reference point 17 should remain stationary with respect to the objective housing 6 and with respect to the base body 5.

Figure 5:
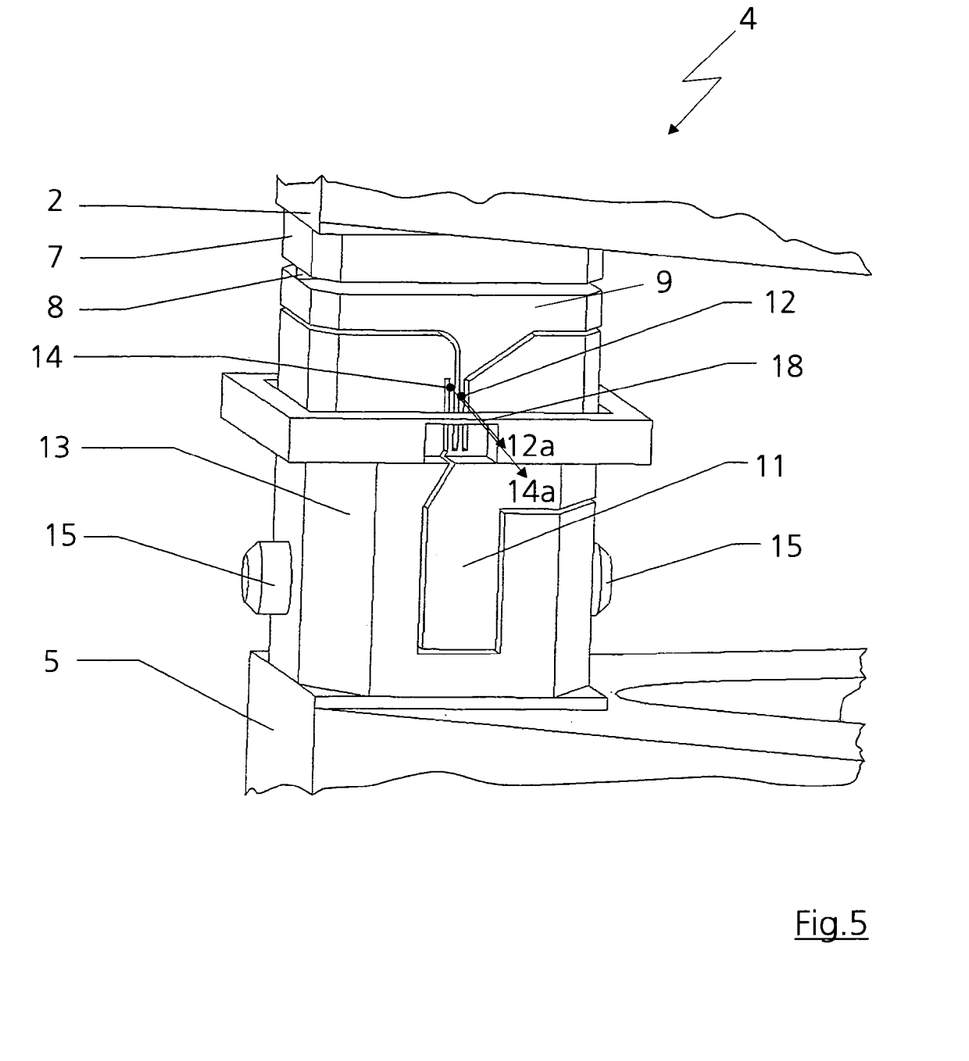
FIG. 5 is a perspective illustration of an alternative design of the manipulator unit.

FIG. 5 shows an alternative design of the manipulator unit 4. In order to fix the point of rotation of the actuator 11 unambiguously with respect to the manipulator foot 13, in this case the actuator 11 is additionally connected to the manipulator foot 13 by a third solid body joint 18, which is likewise implemented as a leaf spring. The solid body joint 14, together with the solid body joint 18, forms a crossed-spring joint, the solid body joint 18 in FIG. 5 being implemented as a double leaf spring, and a rear solid body joint part being hidden by the manipulator unit 4.

As can be seen, the manipulator foot 13 can thus be moved relative to the optical element 3. In this case, the first solid body joint 14 has a first axis of rotation 14a of the actuator 11, and the second solid body joint 12 has a second axis of rotation 12a of the movable manipulator part 9, such that rotation about the first axis of rotation 14a results in displacement of the second axis of rotation 12a relative to the manipulator foot 13, the position of the first axis of rotation 14a and of the second axis of rotation 12a being determined at the same time by the third solid body joint 18. As can be seen, the third solid body joint 18 connects the manipulator foot 13 and the movable actuator 11. The third solid body joint 18 also connects the movable manipulator part 9 to the movable actuator 11, with which the third solid body joint 18 also connects the movable manipulator part 9 to the manipulator foot 13.

As can also be seen from FIG. 5, the third solid body joint 18 is arranged to be rotated through an angle in the deflection direction relative to the solid body joints 12 and 14 with regard to the respective deflection directions of the three solid body joints 12, 14 and 18. The angle can be between 30 and 150°, an angle of 90° being illustrated by way of example.

Figure 6:
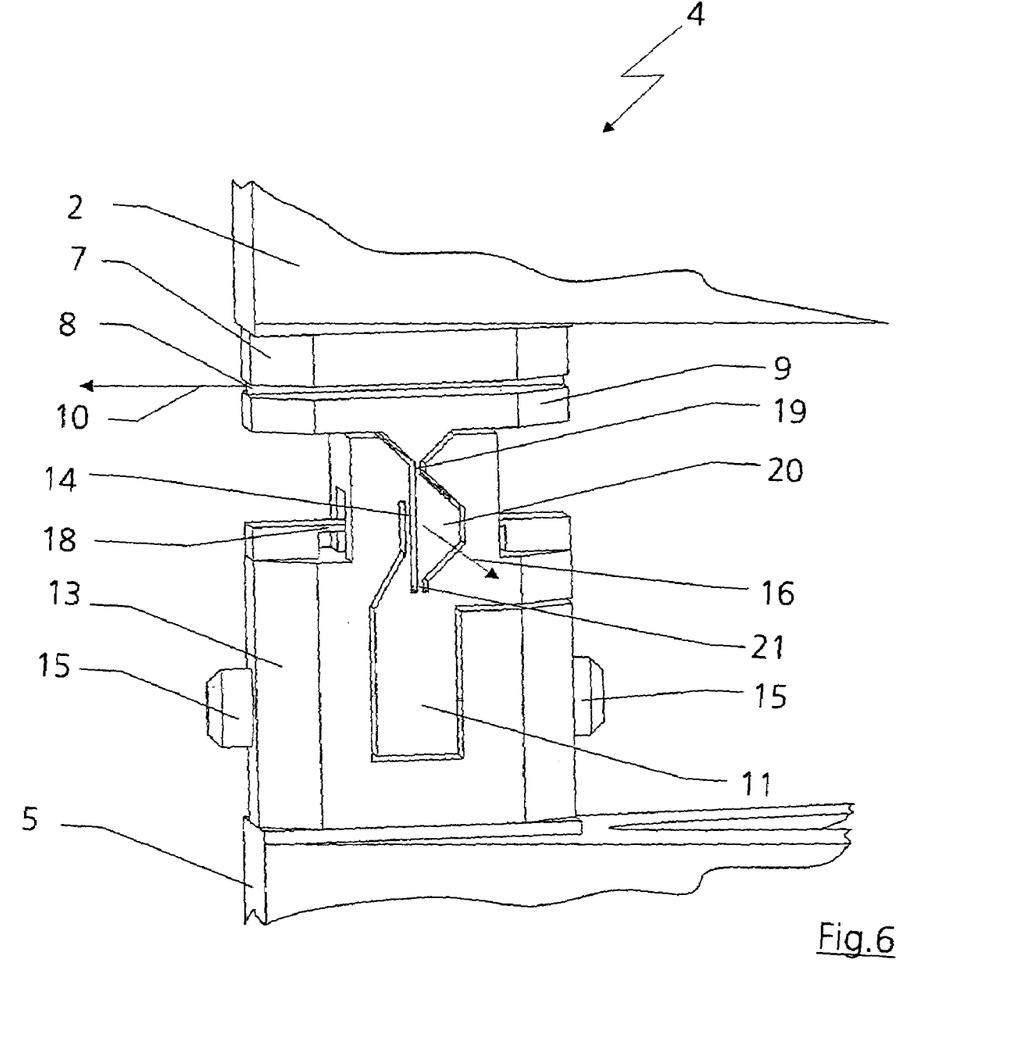
FIG. 6 is a perspective illustration of a further alternative design of the manipulator unit.

FIG. 6 shows a further possibility of implementing the manipulator unit 4. In this design configuration of the manipulator unit 4, the solid body joint 18 is provided in the inner part of the manipulator unit 4 or displaced into the latter, likewise again forming a crossed-spring joint with the solid body joint 14. A group comprising a plurality of solid body joints, namely a tilting spring joint 19, an intermediate element 20 and a tilting spring joint 21, performs the same function as the solid body joint 12, the aforementioned group connecting the movable manipulator part 9 to the actuator 11. If the actuator 11 is fixed in its position by the linear actuating elements 15, the manipulator head 7 is predefined a tilting movement about the axis 16 and a translational movement in the direction of the axis 10 with respect to the manipulator foot 13 by the arrangement of the solid body joints 19, 20 and 21.

Figure 7:
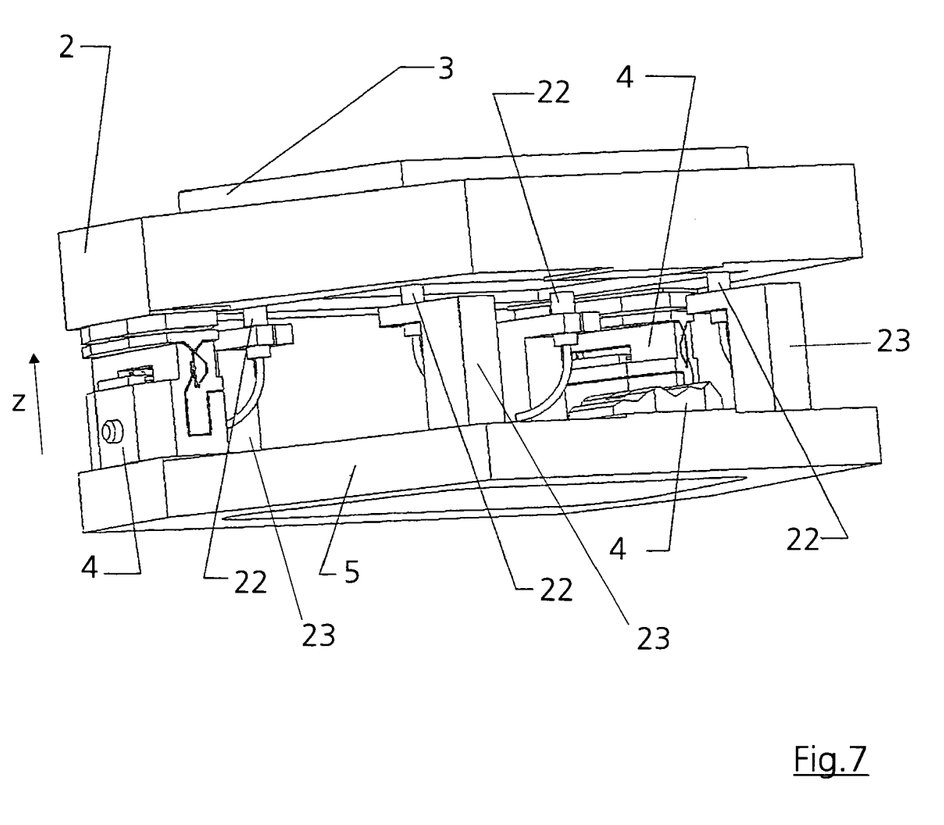
FIG. 7 is a perspective illustration of the holding and positioning apparatus with an illustration of sensors.

FIG. 7 shows a perspective view of the holding and positioning apparatus 1 with an illustration of sensors 22. It is advantageous to measure the movement of the mirror 3 with respect to the base body 5 during the lifting and tilting adjustment of the mirror 3, in order in this way to be able to monitor the magnitude of the lift and the tilt and therefore to be able to correct any possible disruptive movement. The movements relevant to the mirror 3 are the lift and two tilts about respectively mutually independent axes 10 and 16, which lie at right angles to the lifting movement, namely the z direction. In the exemplary embodiment according to FIG. 7, two manipulator units 4 are illustrated completely, one manipulator unit 4 being merely indicated in order to illustrate the sensors 22. In order to measure the three movements, at least three sensors 22 are provided, which measure the change in the distance, for example in the lifting direction, at three points on the mirror 3 or on the mounting ring 2. The sensors 22, preferably formed as capacitive sensors, are arranged on mountings 23. The sensors 22 should be arranged as far apart from one another as possible, in order to achieve a high resolution for the tilt angle measurement by means of a broad base.

Figure 8:
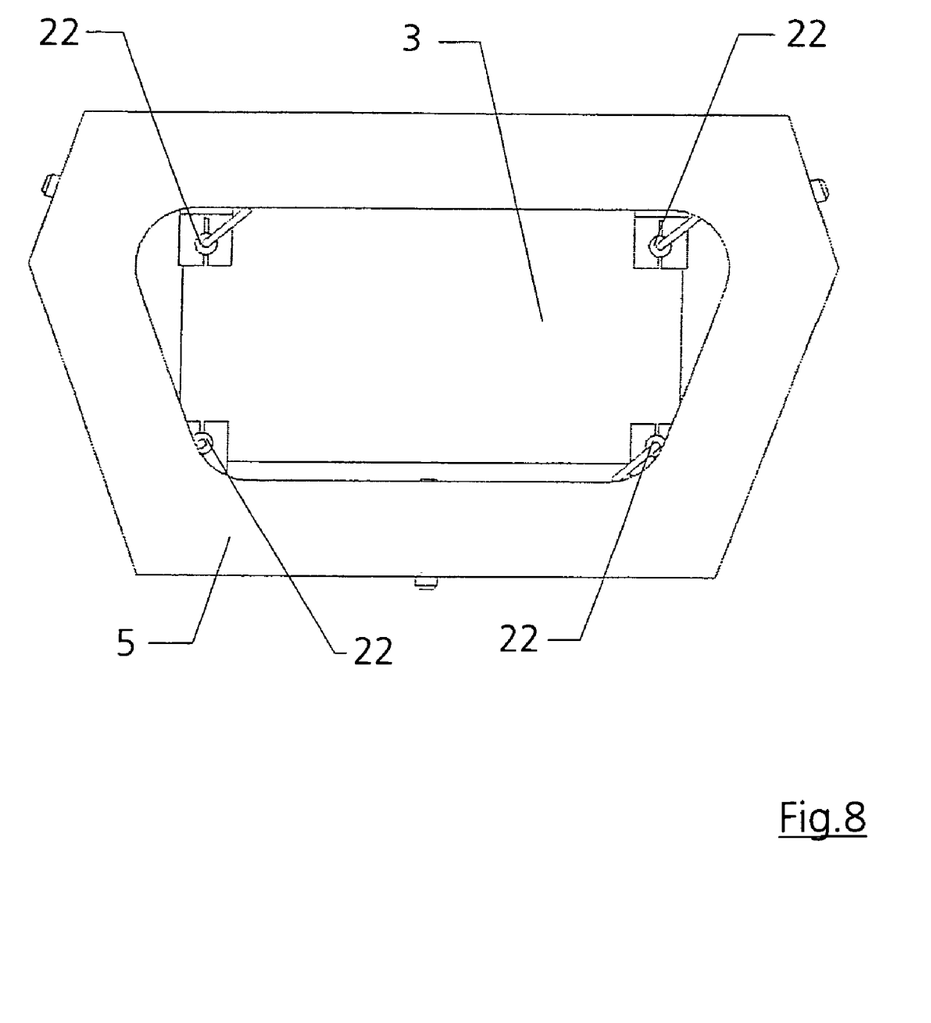
FIG. 8 is an illustration of the principle of the holding and positioning apparatus with an illustration of the sensors in plan view.

In FIG. 8, which illustrates the holding and positioning apparatus 1 (the manipulator units 4 are hidden) in very simplified form, the holding and positioning apparatus 1 has the sensors 22. In order to average out measurement errors, additional sensors 22 can be provided on further mountings 23.

In the exemplary embodiments according to FIG. 7 and FIG. 8, in each case four sensors 22 are provided for the measurement and are arranged or fitted at the four corners of the mirror 3. As a result of such an arrangement, the sensors 22 are located very far apart, in order to ensure the best possible tilt angle resolution.

By means of the holding and positioning apparatus 1 in conjunction with the manipulator units 4, the mirror 3 can be displaced in the z direction and tilted about two mutually independent axes in the mirror plane 3a. By means of this stiff attachment, undesired vibration of the mirror 3 is suppressed by the holding and positioning apparatus 1, and impermissible imaging errors can be minimized.

What is claimed is:

1. A holding and positioning apparatus for an optical element, comprising:
    a mounting ring configured for supporting an optical element comprising an optical axis; and
    at least one manipulator unit supporting the mounting ring, the at least one manipulator unit comprising a linear actuating element, a manipulator head, a movable manipulator part and a manipulator foot; and the manipulator head being connected to the movable manipulator part via a first solid body joint, and the movable manipulator part being connected to the manipulator foot via an actuator and a second solid body joint, wherein said actuator is connected to the manipulator foot via a third solid body joint, wherein the linear actuating element is coupled to the manipulator foot and the actuator, wherein the second solid body joint is provided in a laterally offset arrangement relative to the third solid body joint which allows the second solid body joint to move in a direction along the optical axis when the actuator is tilted, and wherein the first solid body joint is movable into a tilt-direction which is different from the optical axis.

2. The holding and positioning apparatus as claimed in claim 1, wherein the at least one manipulator unit comprises three manipulator units arranged in such a way that a reference point lies at the geometric center of gravity of a triangle defined by the three manipulator units.

3. The holding and positioning apparatus as claimed in claim 1, wherein the at least one manipulator unit comprises a crossed-spring joint.

4. The holding and positioning apparatus as claimed in claim 3, wherein the crossed-spring joint comprises a double leaf spring.

5. The holding and positioning apparatus as claimed in claim 1 further comprising at least three sensors being provided in order to measure lifting and tilting movements of the optical element with respect to a base body.

6. The holding and positioning. apparatus as claimed in claim 5, wherein the at least three sensors comprise capacitive sensors.

7. The holding and positioning apparatus as claimed in claim 1, wherein the at least one manipulator unit is configured for moving the optical element on an axis at right angles to a plane of the optical element.

8. The holding and positioning apparatus as claimed in claim 1, wherein the at least one manipulator unit is configured for tilting the optical element about two mutually independent axes.

9. The holding and positioning apparatus as claimed in claim 1, wherein the optical element comprises a mirror.

10. The holding and positioning apparatus as claimed in claim 1, wherein the optical element comprises a deflection mirror.

11. The holding and positioning apparatus as claimed in claim 1, wherein the optical element is configured for use as a projection objective for semiconductor lithography.

12. The holding and positioning apparatus as claimed in claim 11, wherein the projection objective comprises a catadioptric objective having a radial arm.

13. The holding and positioning apparatus as claimed in claim 1, wherein at least one of the first, second and third solid body joints comprise a leaf spring.

14. The holding and positioning apparatus as claimed in claim 1, wherein the third solid body joint defines a first axis of rotation of the actuator and the second solid body joint defines a second axis of rotation of the movable manipulator part in such a way that rotation about the first axis of rotation results in displacement of the second axis of rotation relative to the manipulator foot, and the position of the first and/or second axis of rotation being determined at the same time by at least the first solid body joint.

15. The holding and positioning apparatus as claimed in claim 14, wherein the first solid body joint is arranged to be rotated through an angle in a deflection direction relative to the third and/or second solid body joints with regard to the respective deflection directions of the third and/or second solid body joints.

16. The holding and positioning apparatus as claimed in claim 15, wherein the angle comprises a range between 30° and 150°.

* * * * *